United States Patent
Jeong et al.

(10) Patent No.: US 6,777,322 B2
(45) Date of Patent: Aug. 17, 2004

(54) METHOD FOR FABRICATING A MULTI-LAYERED DIELECTRIC LAYER INCLUDING INSULATING LAYER HAVING SI-CH₃ BOND THEREIN

(75) Inventors: Hyun-dam Jeong, Kyungki-do (KR); Hee-sook Park, Seoul (KR); Hong-jae Shin, Seoul (KR); Byeong-jun Kim, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/255,639

(22) Filed: Sep. 27, 2002

(65) Prior Publication Data

US 2003/0118796 A1 Jun. 26, 2003

Related U.S. Application Data

(62) Division of application No. 09/577,075, filed on May 23, 2000, now Pat. No. 6,485,815.

(30) Foreign Application Priority Data

May 24, 1999 (KR) ............................................ 99-18663

(51) Int. Cl.⁷ ........................................ H01L 21/4763
(52) U.S. Cl. .................................................... 438/628
(58) Field of Search ............................... 438/628, 623, 438/624, 795

(56) References Cited

U.S. PATENT DOCUMENTS

| | | | | |
|---|---|---|---|---|
| 4,868,096 A | | 9/1989 | Nakayama et al. | 430/329 |
| 6,057,251 A | | 5/2000 | Goo et al. | 438/788 |
| 6,121,130 A | * | 9/2000 | Chua et al. | 438/623 |
| 6,159,871 A | | 12/2000 | Loboda et al. | 438/786 |
| 6,303,192 B1 | * | 10/2001 | Annapragada et al. | 427/527 |
| 6,303,525 B1 | | 10/2001 | Annapragada et al. | 438/782 |
| 6,326,692 B1 | | 12/2001 | Pangrle et al. | 257/758 |

OTHER PUBLICATIONS

M. Matsuura, et al. "An Advanced Interlayer Dielectric System With Partially Converted Organic Sog by Using Plasma Treatment"; Proceedings VMIC (1993), Jun. 8–9, 1993 VMIC Converence; pp. 113–115.

* cited by examiner

Primary Examiner—David Nelms
Assistant Examiner—Quoc Hoang
(74) Attorney, Agent, or Firm—Volentine Francos, PLLC

(57) ABSTRACT

A multi-layered dielectric layer wherein the adhesion characteristic of an insulating layer including a Si—CH₃ bond is improved, and a method of forming the same are provided. The multi-layered dielectric layer is formed on conductive patterns and includes a first insulating layer formed of a layer having a low dielectric constant including the Si—CH₃ bond. In order to improve the adhesion characteristic of the first insulating layer, an adhesion surface is formed on the surface of the first insulating layer by treating the first insulating layer with plasma. In an alternative, the adhesion characteristics of the first insulating layer is improved by forming a buffer layer on the first insulating layer so that dipole—dipole interaction occurs between the first insulating layer and the buffer layer.

9 Claims, 11 Drawing Sheets

MSQ

FOx

METHOD FOR FABRICATING A MULTI-LAYERED DIELECTRIC LAYER INCLUDING INSULATING LAYER HAVING SI-CH₃ BOND THEREIN

CROSS-REFERENCE TO RELATED APPLICATIONS

This is a divisional application of application Ser. No. 09/577,075, filed May 23, 2000, now U.S. Pat. No. 6,485,815, which is hereby incorporated by reference in its entirety for all purposes. The present application claims priority under 35 U.S.C. §119 to Korean Patent Application No. 99-18663 filed on May 24, 1999, the entire contents of which are hereby incorporated by reference for all purposes.

BACKGROUND OF THE INVENTION

1. Field of the Invention

The present invention relates to a method for manufacturing a semiconductor device, and more particularly, to a method for fabricating a multi-layered dielectric layer for reducing parasitic capacitance generated between conductive patterns which exist on the same layer or between conductive layers formed in different levels.

2. Description of the Related Art

As the level of integration and speed of semiconductor devices increases, a design rule is reduced and a multi-layered metal wiring layer is required. As a result, the distance between metal wiring layers on the same layer is gradually reduced and the widths of the metal wiring layers and the distance between the metal wiring layers are reduced. As the width of metal wiring layers is reduced, the resistance thereof increases proportionally. As the distance between the metal layers is reduced, a parasitic capacitance between the metal wiring layers increases. The increase of the resistance or the parasitic capacitance may significantly reduce the speed of the semiconductor device.

Accordingly, parasitic resistance R and capacitance C components which exist between metal wiring layers adjacent to each other on the same layer or wiring layers vertically adjacent to each other, are most important.

In a metal wiring system, the parasitic resistance and capacitance elements deteriorate the electrical performance of a device due to the RC-induced propagation delays. Also, the parasitic resistance and capacitance elements which exist between the wiring layers increase the overall chip power dissipation and increase the amount of signal cross talk. Therefore, in an ultra-large-scale integrated semiconductor device, it is very important to develop suitable low-RC multi-level interconnect technologies.

It is essential to use an intermetal dielectric film having a low dielectric constant in order to form a high performance multi-level interconnect structure having low RC.

Research for using methyl silsesquioxane (MSQ), which is a spin-on-glass (SOG) insulating material, as a material which can be used as an intermetal dielectric film which can realize a low dielectric constant, is proceeding.

FIGS. 1A and 1B show the basic structures of MSQ and a flowable oxide (FOx), respectively. As shown in FIG. 1A, the basic structure of MSQ is a cage structure formed of Si—O—Si bonds. The basic structure of MSQ is similar to the basic structure of FOx. FOx is a currently used insulating material and has a dielectric constant no less than 3.0. Meanwhile, MSQ can show a relatively low dielectric constant of 2.5 through 3.0 according to the amount of methyl group (—CH₃) included in the basic structure thereof. MSQ has a low dielectric constant because the density in the MSQ layer is low, and a Si—CH₃ bond has a strong covalent bonding characteristic and has low hygroscopicity since MSQ has a cage structure like that of FOx.

Therefore, if MSQ is used for forming the interlayer dielectric film of the semiconductor device, it is very advantageous since it is possible to use process conditions for FOx already set-up in the currently used semiconductor manufacturing equipment with slight change.

However, while the edge of the polygon structure of FOx is terminated by a Si—H bond, the edge of the polygon structure of MSQ is terminated by Si—CH₃ and Si—H bonds. Therefore, when MSQ is applied to the intermetal dielectric film, a steric hindrance between the MSQ layer and an upper dielectric layer deposited on the MSQ layer is very large due to relatively bulky —CH₃ group on the surface of the MSQ layer. As a result, bonding power between the MSQ layer and the upper dielectric layer is weakened. Accordingly, adhesion between, the two layers is weakened.

When the upper dielectric layer is planarized by, for example, a chemical mechanical polishing (CMP) method or a conductive layer is polished for forming a via contact plug in a successive process in a state where the adhesion between the MSQ layer and the upper dielectric layer is weakened, a peeling off phenomenon where the upper dielectric layer is lifted and taken off from the MSQ layer occurs. This is because the bonding power between the MSQ layer and the upper dielectric layer cannot withstand the physical force transmitted from the surface of a wafer to an interface between the MSQ layer and the upper dielectric layer during the CMP process.

The above-mentioned problem is not restricted to MSQ but occurs in other insulating layers containing the Si—CH₃ bond such as silicon oxycarbide (SiOC).

When the peeling off phenomenon of the upper dielectric layer is serious, the upper dielectric layer is taken off during the process of planarizing the upper dielectric layer. As a result, a case may result where upper dielectric layers are removed by the polishing process, and a lower conductive layer is exposed.

SUMMARY OF THE INVENTION

To solve the above problem and one or more of the problems due to limitations and disadvantages of the related art, it is an object of the present invention to provide a multi-layered dielectric layer including an insulating layer which has a Si—CH₃ bond and has excellent bonding power with an upper dielectric layer.

It is another object of the present invention to provide a method for fabricating a multi-layered dielectric layer including an insulating layer having a Si—CH₃ bond with enhanced bonding power, by which it is possible to improve adhesion thereof to an upper dielectric layer formed on the insulating layer.

To achieve the first object, there is provided a multi-layered dielectric layer according to an aspect of the present invention, including a first insulating layer formed on conductive patterns on a semiconductor substrate, the first insulating layer having Si—CH₃ bonds therein, an adhesion surface formed to be exposed on the upper surface of the first insulating layer, wherein the adhesion surface is part of the first insulating layer and has a carbon component of smaller quantity than the remaining part of the first insulating layer, and a second insulating layer formed on the adhesion surface of the first insulating layer so that a dipole—dipole interaction occurs between the adhesion surface and the second insulating layer.

To achieve the first object, there is provided a multi-layered dielectric layer according to another aspect of the present invention, including a first insulating layer formed on conductive patterns on a semiconductor substrate, the first insulating layer having Si—$CH_3$ bonds therein, a buffer layer formed on the first insulating layer, wherein the buffer layer does not include the Si—$CH_3$ bond therein, and is formed so that a dipole—dipole interaction occurs between the first insulating layer and the buffer layer, and a second insulating layer formed on the buffer layer.

The first insulating layer is formed of methyl silsesquioxane (MSQ) or silicon oxycarbide (SiOC).

The buffer layer is preferably formed of undoped silicate glass (USG).

To achieve the second object, there is provided a method for forming a multi-layered dielectric layer according to an aspect of the present invention. In the method for forming the multi-layered dielectric layer, a first insulating layer having Si—$CH_3$ bonds is formed on conductive patterns on a semiconductor substrate. An adhesion surface including a carbon component of less quantity than the first insulating layer is formed on the surface of the first insulating layer by treating the first insulating layer with plasma. A second insulating layer is formed on the adhesion surface so that a dipole—dipole interaction occurs between the adhesion surface and the second insulating layer.

$O_2$, $N_2O$ or $NH_3/N_2$ plasma is used to treat the first insulating layer.

To achieve the second object, there is provided a method of forming a multi-layered dielectric layer according to another aspect of the present invention. In the method for forming the multi-layered dielectric layer, a first insulating layer including a Si—$CH_3$ bond is formed on conductive patterns on a semiconductor substrate. A buffer layer is formed on the first insulating layer so that a dipole—dipole interaction occurs between the first insulating layer and the buffer layer, wherein the buffer layer does not have Si—$CH_3$ bonds therein. A second insulating layer is formed on the buffer layer.

The buffer layer is preferably formed of undoped silicate glass (USG) to a thickness of 50 Å through 1000 Å.

According to the present invention, it is possible to reduce RC delays which can be generated in a metal wiring system, by using material having a low dielectric constant for fabricating an intermetal dielectric film. Also, by fabricating a layer having a low dielectric constant that includes the Si—$CH_3$ bond, it is possible to significantly improve adhesion between the layer having the low dielectric constant and an upper dielectric layer by removing the Si—$CH_3$ bond on the surface of the layer having the low dielectric constant.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

In order to improve bonding power between an insulating layer such as a methyl silsesquioxane (MSQ) layer including a Si—$CH_3$ bond therein, and an upper dielectric layer, it is necessary to remove the —$CH_3$ group, which constitutes the Si—$CH_3$ bond, from the surface of the insulating layer.

Accordingly, an MSQ layer has been selected as a sample, various treatments have been performed on the surface of the MSQ layer, and the effects of the treatments have been estimated by the inventors in order to find an effective method for removing the —$CH_3$ group from the surface of the insulating layer including the Si—$CH_3$ bond.

Figure 1A:
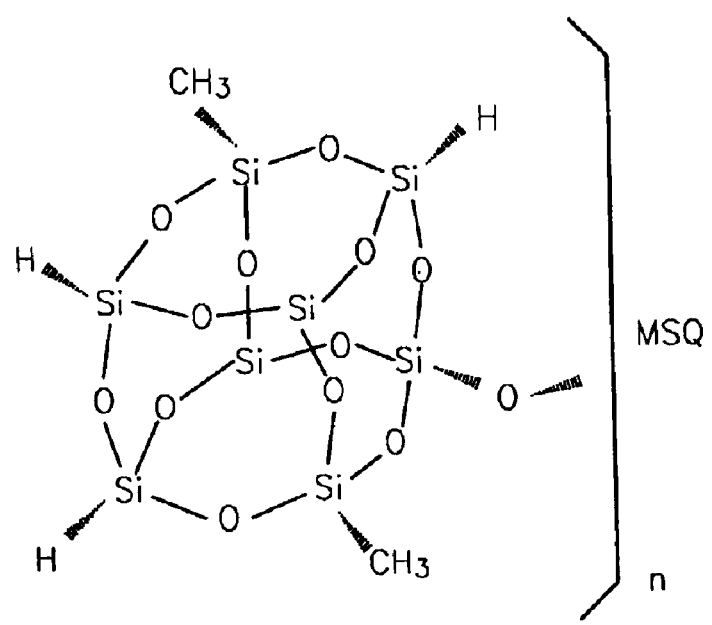
FIGS. 1A and 1B show the basic structures of methyl silsesquioxane (MSQ) and flowable oxide (FOx), respectively.
Figure 1B:
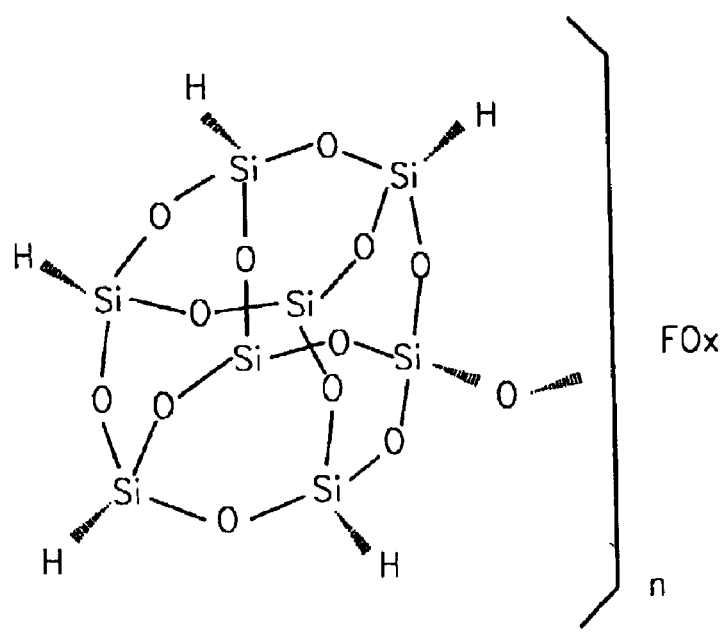
Figure 2:
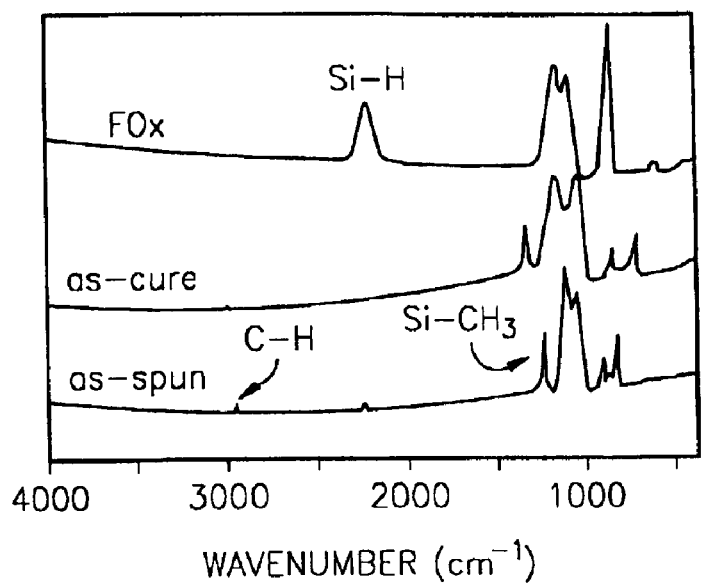
FIG. 2 is a graph showing the change of Fourier transform infrared (FT-IR) spectrums after baking the MSQ layer.

To determine the component and bonding state of the MSQ layer, a FT-IR spectrum was observed right after spin coating MSQ on a silicon substrate ("as-spun") and after baking the MSQ layer formed as a result at a temperature of 400° C. for thirty minutes ("as-cure"), and the change of the Fourier transform infrared (FT-IR) spectrum is shown in FIG. 2. For a comparison, the results of analyzing the FT-IR spectrum of a flowable oxide (FOx) are shown.

In FIG. 2, in the "as-spun" and the "as-cure" cases, peaks of Si—$CH_3$ (1260 $cm^{-1}$), Si—H (2250 $cm^{-1}$), and C—H (2930 $cm^{-1}$) are found together with an oxide network (Si—O—Si) (1000 $cm^{-1}$ through 1200 $cm^{-1}$). The above result is significantly different from the results of the "FOx" case where only the peak of Si—H is found, which means that the Si—$CH_3$ bond exists in the MSQ layer. In the peak found by the oxide network, the peak in 1100 $cm^{-1}$ is reduced in the case of the "as-cure", which means that a cage structure in the MSQ layer is partially removed.

Meanwhile the bond strength of a Si—O bond is 193 kcal/mol, while the bond strength of Si—C, Si—H, and C—H bonds are 107.9 kcal/mol, 71.5 kcal/mol, and 80.8 kcal/mol, respectively, which are significantly low. Therefore, MSQ generally has a lower thermal stability than general oxides.

Figure 3:
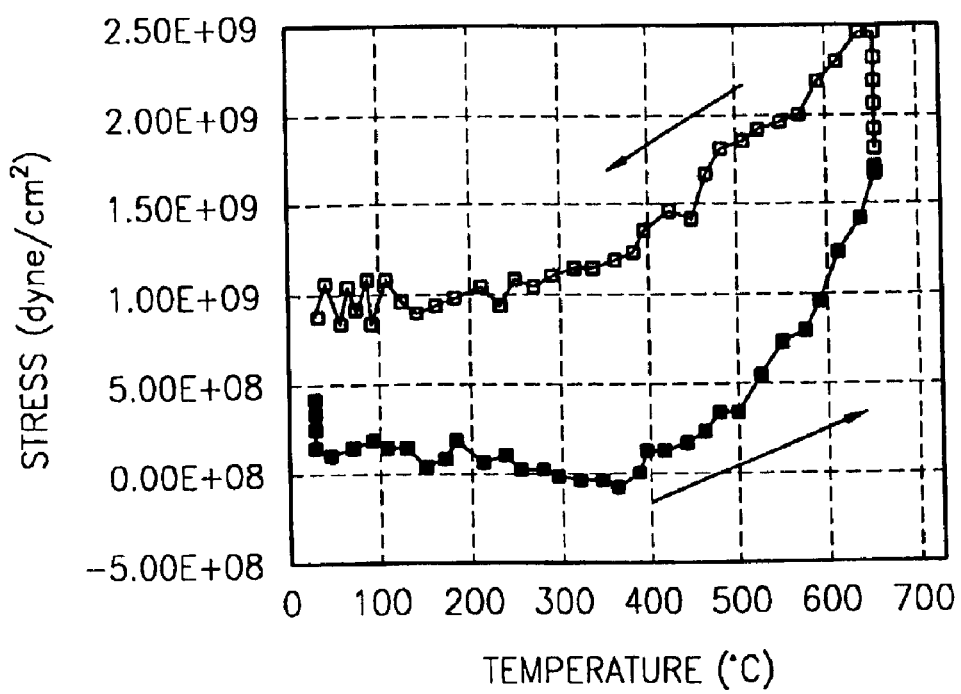
FIG. 3 is a graph showing the stress hysteresis of the MSQ.

FIG. 3 is a graph showing the result of a stress hysterisis experiment performed in order to investigate the thermal stability of the MSQ layer.

In FIG. 3, the stress value does not significantly change when the temperature is below 400° C. This is because the thermal expansion coefficient of the silsesquioxane in MSQ is similar to that of the silicon substrate. This shows that there is little chance of cracking occurring below that temperature. Tensile stress increases at a temperature greater than or equal to 400° C. since a cross-linking reaction which did not completely proceed in the step of baking the MSQ, proceeds, or water is removed. Namely, the MSQ layer begins to change at a temperature of greater than or equal to 400° C. The tensile stress is reduced when the MSQ layer is cooled, which is because the thermal expansion coefficient of the transformed oxide network is less than the thermal expansion coefficient of the silicon substrate.

The pyrolysis chemical species and the desorption temperature of the MSQ layer were investigated by performing thermal desorption spectroscopy (TDS) experiments in order to more precisely investigate the thermal stability of the MSQ layer at the temperature greater than or equal to 400° C.

Figure 4A:
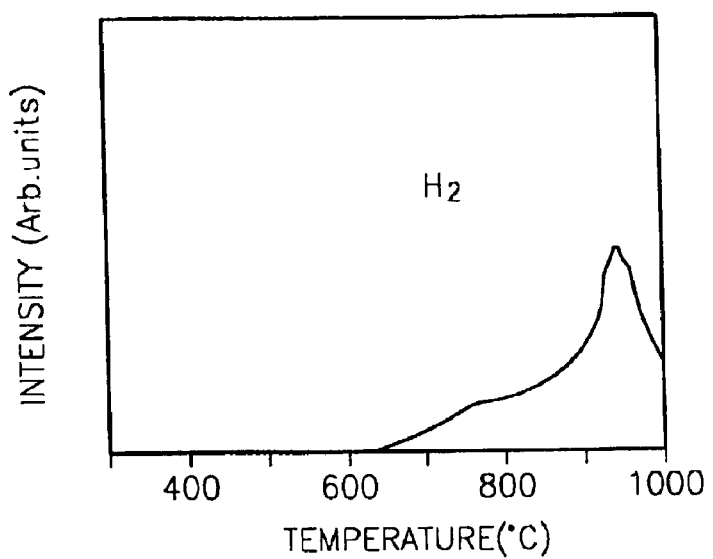
FIGS. 4A, 4B, and 4C are spectrums showing the results of a thermal desorption spectroscopy (TDS) experiment for investigating the pyrolysis chemical species and the desorption temperature thereof.
Figure 4B:
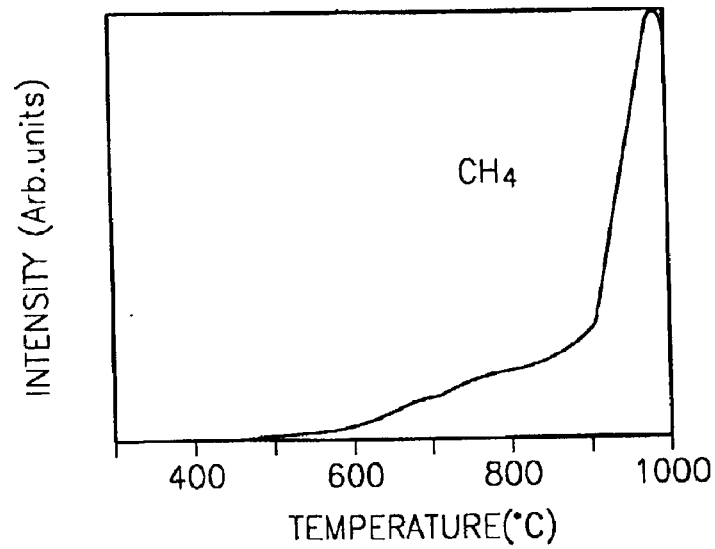
Figure 4C:
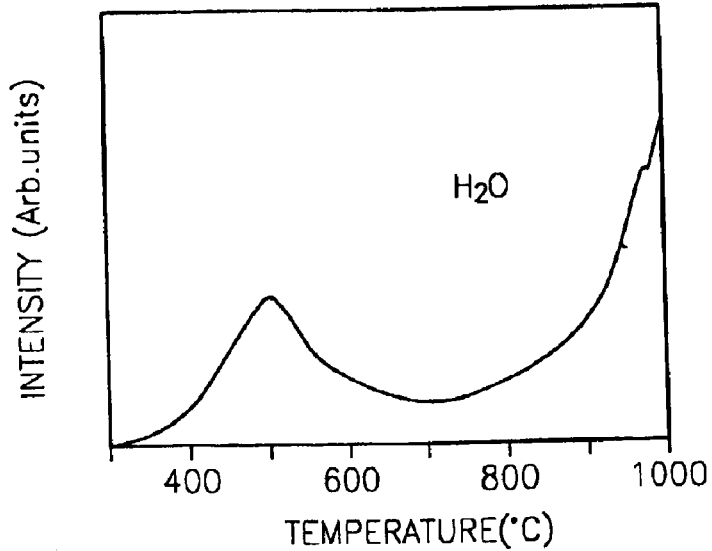

FIGS. 4A, 4B, and 4C are TDS spectrums of the MSQ obtained by performing the above experiments.

As shown in FIG. 4A, $H_2$ is desorbed at 600° C. As shown in FIG. 4B, $CH_4$ is desorbed at 500° C. This is due to the decomposition of Si—H and Si—$CH_3$ bonds, respectively. Namely, it means that the cross-linking reaction partially starts to proceed at a temperature greater than or equal to 500° C.

As shown in FIG. 4C, the desorption of $H_2O$ starts at 400° C. This is why the temperature at which the stress value begins to change is lower than the desorption temperature of $H_2$ or $CH_4$.

It is noted from the results of the above experiments that $H_2O$ begins to be desorbed at 400° C. in the MSQ layer, and that the Si—H and Si—C bonds are partially broken and the transformation of the MSQ layer proceeds at a temperature greater than or equal to 500° C.

The MSQ layer is treated under an $O_2$ plasma atmosphere applied in an $O_2$ ashing process for stripping a photoresist in general semiconductor device manufacturing processes, in order to confirm reaction between the Si—$CH_3$ bond in the MSQ layer and oxygen radicals generated by the $O_2$ plasma.

Figure 5:
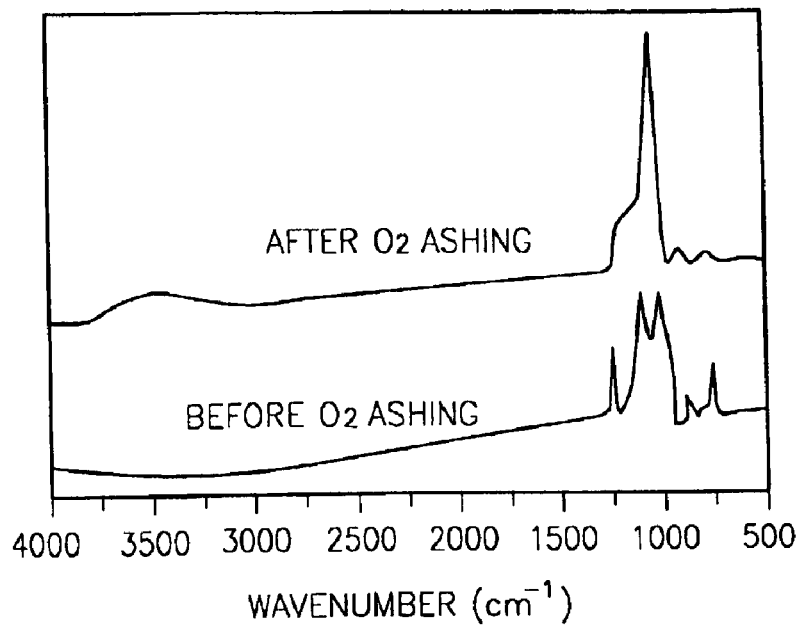
FIG. 5 shows the FT-IR spectrums before and after the MSQ layer is treated with $O_2$ plasma under an $O_2$ ashing condition.

FIG. 5 shows the FT-IR spectrums before and after the MSQ layer is treated with $O_2$ plasma under an $O_2$ ashing condition as mentioned above.

It is noted from FIG. 5 that the Si—H and Si—$CH_3$ bonds are removed and that a Si—O—Si peak shown within a range of 1000 $cm^{-1}$ through 1200 $cm^{-1}$ is changed after the MSQ layer is treated with $O_2$ plasma under the $O_2$ ashing condition. It is noted from the above that the cage structure of MSQ is changed into a structure similar to the structure of a general oxide network after the MSQ layer is treated with $O_2$ plasma.

Table 1 shows the results of performing an X-ray photoelectron spectroscopy (XPS) analysis on the surface of the MSQ layer before and after the MSQ layer is treated with $O_2$ plasma under the above $O_2$ ashing condition.

TABLE 1

| Components detected in the XPS analysis | [Si] (%) | [O] (%) | [C] (%) | [O]/[Si] |
|---|---|---|---|---|
| Before $O_2$ ashing process | 34 | 47 | 19 | 1.4 |
| After $O_2$ ashing process | 33 | 68 | 0.0 | 2.1 |

In Table 1, after the MSQ layer is treated with $O_2$ plasma by the $O_2$ ashing process, a carbon concentration becomes 0.0% and a ratio of [O] to [Si], [O]/[Si] becomes 2.1, which is almost the same as the value of a general oxide ([O]/[Si]= 2). The above result coincides with the analysis result of FIG. 5.

It is noted from the above experiment results that the —$CH_3$ group which constitutes the Si—$CH_3$ bond is removed from the surface of the MSQ layer after the MSQ layer is treated with $O_2$ plasma under an $O_2$ ashing condition.

The inventors have estimated the changes in the MSQ layer in the case that various plasma treatments are performed on the MSQ layer, and that a buffer layer formed of materials having components different from the components of the MSQ layer is fabricated on the surface of the MSQ layer as follows, respectively.

The various plasma treatments performed on the MSQ layer coated on the silicon substrate, and treatment conditions thereof are provided in Table 2.

TABLE 2

| | | Treatment condition | | | | |
|---|---|---|---|---|---|---|
| Treatment method | Treatment content | RF power supply (MHZ/W) | Temperature (° C.) | Pressure (torr) | Treatment time (seconds) | Gas flow (sccm) |
| Plasma treatment | $O_2$ plasma | 13.56/1500 | 400 | 2.2 | 80 | $O_2$ 2500 |
| | $N_2O$ plasma | 13.56/160 | 400 | 2.8 | 10 | $N_2O$ 1200 |
| | $NH_3/N_2$ plasma | 13.56/200 | 400 | 2 | 100 | $NH_3$ 80 $N_2$ 1500 |

When the buffer layer is formed on the MSQ layer, an undoped silicate glass (USG) layer, to be specific, an oxide layer formed of $O_3$ and tetraethyl orthosilicate (TEOS) by a CVD method (hereinafter, "$O_3$-TEOS layer"), is formed to a thickness of 1000 Å as the buffer layer.

Figure 6:
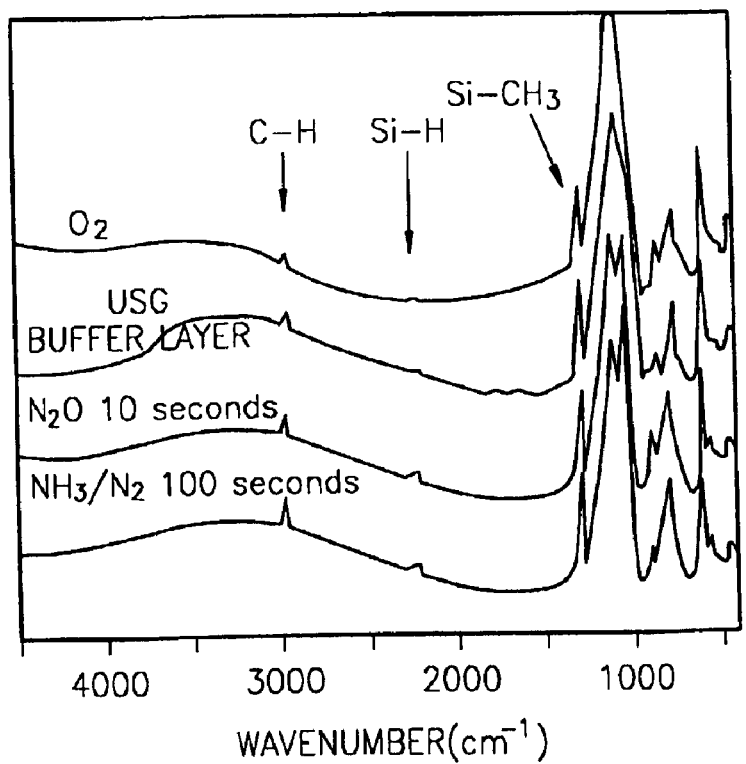
FIG. 6 is a graph showing the changes of the FT-IR spectrums for estimating the change of the MSQ layer according to various methods for processing the MSQ layer.

FIG. 6 shows the result of investigating the changes of the FT-IR spectrums in order to estimate the changes in the MSQ layer according to the above four treatment methods.

As shown in FIG. 6, when the MSQ layer is treated with $N_2O$ plasma and $NH_3/N_2$ plasma, the FT-IR spectrums are not significantly different from the FT-IR spectrums before the MSQ layer is treated with plasma, as shown in FIG. 5. However, when the USG layer is formed on the MSQ layer as the buffer layer and the MSQ layer is treated with $O_2$ plasma, C—H and Si—H bond peaks are significantly reduced.

FIGS. 7A through 7D are spectrums obtained by performing a secondary ion mass spectrometry (SIMS) analysis in order to investigate the change in the MSQ layer with respect to the depth of the MSQ layer treated by the above four methods. Here, since it was not possible to know the thickness of the MSQ layer affected by the plasma treatment previously, the SIMS analysis was performed after the thick MSQ layer formed on a silicon substrate to a thickness of 9000 Å had been treated by the above four methods.

In FIGS. 7A through 7D, the position of the interface between the MSQ layer and the silicon substrate can be determined by the position at which the number of times of detection of impurities per second, namely, the concentration level of Si indicated as "counts per second (C/S)" increases and the concentration levels of C and O decrease. Also, the effect of treating the surface of the MSQ layer by plasma can be noted from the degree of the change of the concentration level of C.

Figure 7A:
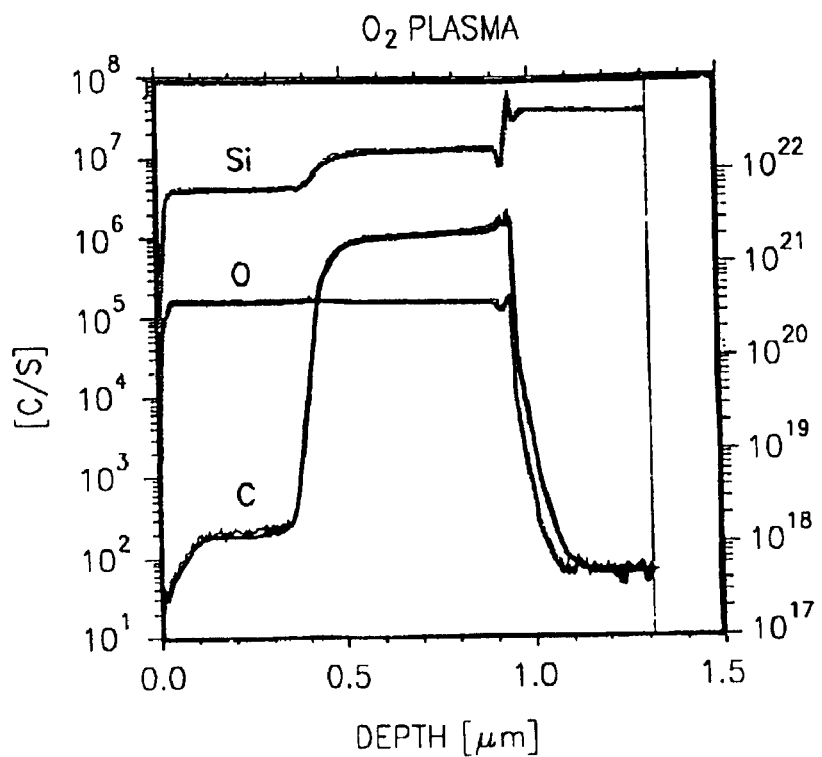
FIGS. 7A through 7D are secondary ion mass spectrometry (SIMS) spectrums showing changes of the MSQ layer with respect to depth, obtained by processing the MSQ layer by different methods.

The amount of carbon decreases to a depth of about 3500 Å from the surface of the MSQ layer in the case of $O_2$ plasma treatment as shown in FIG. 7A. In the case of forming the buffer layer as shown in FIG. 7D, the intensity level of carbon continuously changes to a depth of about 3000 Å from the surface of the MSQ layer, considering the thickness of the USG layer of 1000 Å from the analyzed surface.

Figure 7B:
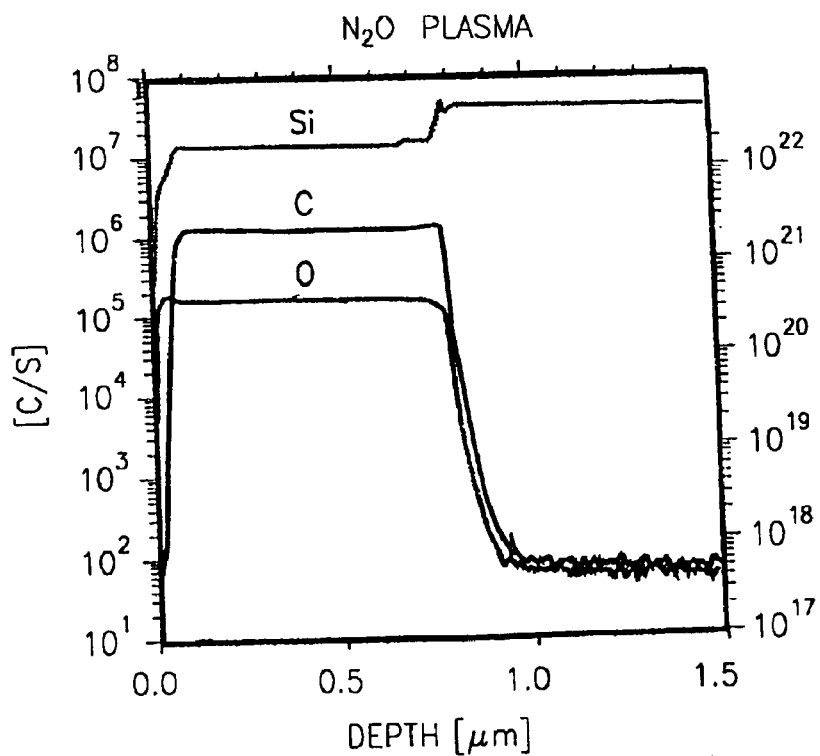
Figure 7C:
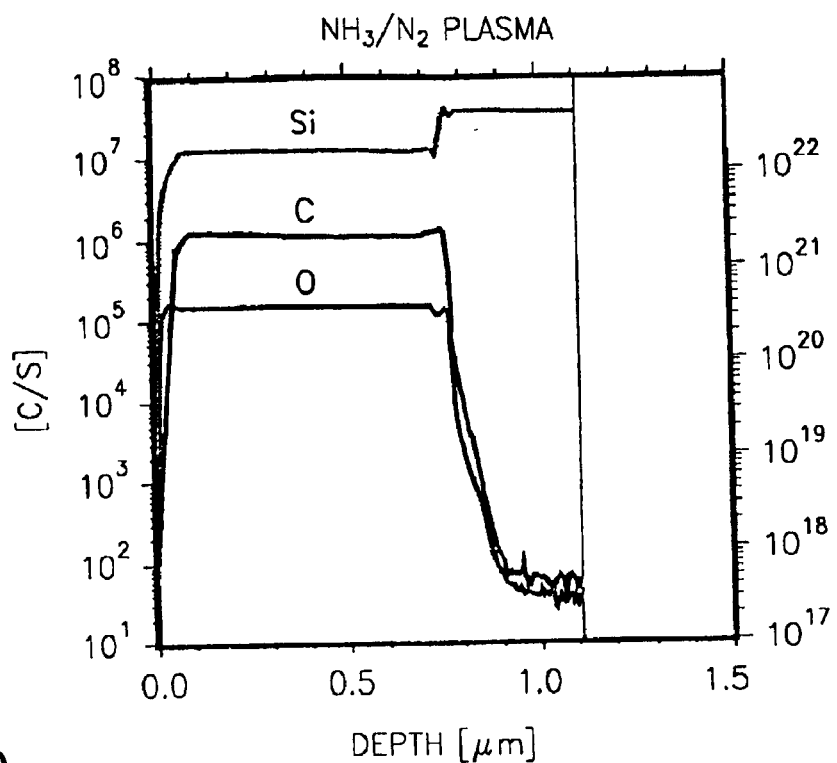
Figure 7D:
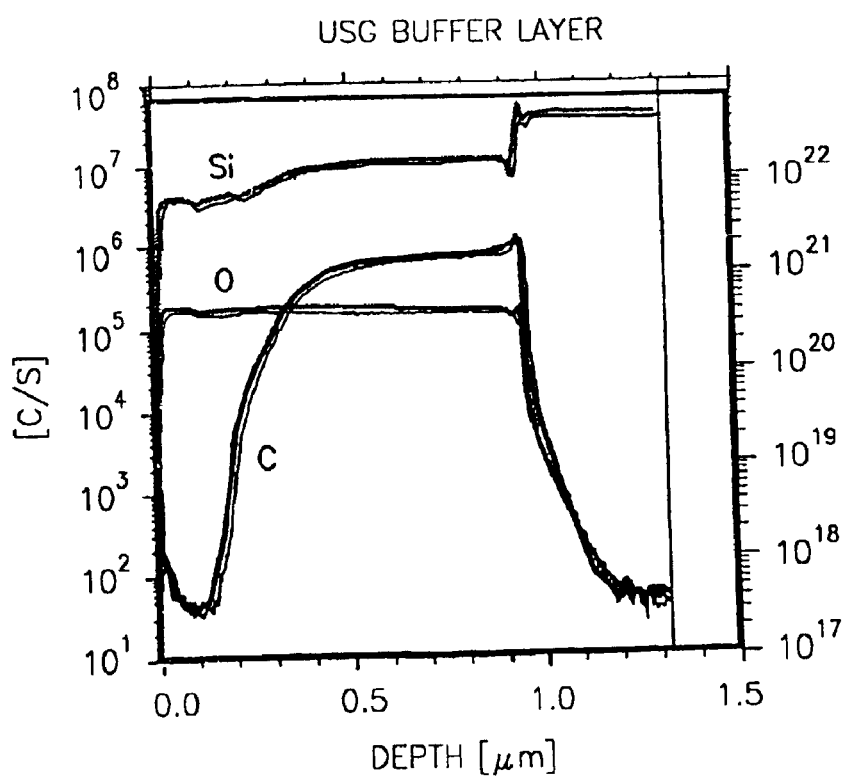

The MSQ layer is changed only in the depth less than 500 Å from the surface of the MSQ layer in the case of the $N_2O$ plasma treatment shown in FIG. 7B and the $NH_3/N_2$ plasma treatment shown in FIG. 7C.

It is noted from the results of FIGS. 7A through 7D that the amount of carbon is reduced at the surface of the MSQ layer in all cases according to the above four surface treatment methods. Accordingly, it is expected that the steric hindrance due to the —$CH_3$ group is removed and a bonding power between the MSQ layer whose surface is treated as mentioned above and an upper dielectric layer deposited on the MSQ layer, is increased, thus the adhesion characteristic of the MSQ layer is improved.

In particular, since the quality of the surface of the MSQ layer is improved and the quality of the MSQ layer throughout its entire thickness does not change significantly when the MSQ layer is treated with $N_2O$ plasma treatment and $NH_3/N_2$ plasma treatment, it is possible to improve the adhesion characteristic of the surface of the MSQ layer, while maintaining the unique characteristics of the MSQ layer.

Figure 8:
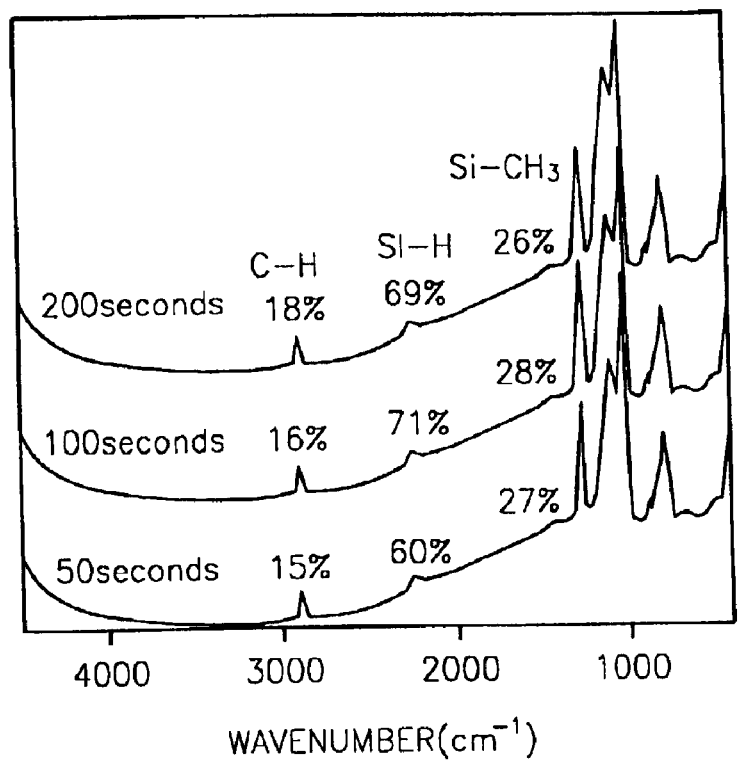
FIG. 8 shows the changes of the FT-IR spectrums of the MSQ layer with respect to processing time, when the MSQ layer is treated with $NH_3/N_2$ plasma.

FIG. 8 shows the changes of the FT-IR spectrums of the MSQ layer when the MSQ layer is treated with $NH_3/N_2$ plasma for 50, 100, and 200 seconds, respectively.

In FIG. 8, the values above the respective peaks display the percentage decrease in the peak intensities with respect to the MSQ layer which is not treated with plasma. It is noted from the results of FIG. 8 that it makes no significant difference by increasing the time for $NH_3/N_2$ plasma treatment.

It is assumed that the above result is obtained since a SiON layer, which is formed on the surface of the MSQ layer while the MSQ layer is treated with $NH_3/N_2$ plasma, provides a self-passivation effect, and thus develops tolerance to continuous plasma treatment.

Figure 9:
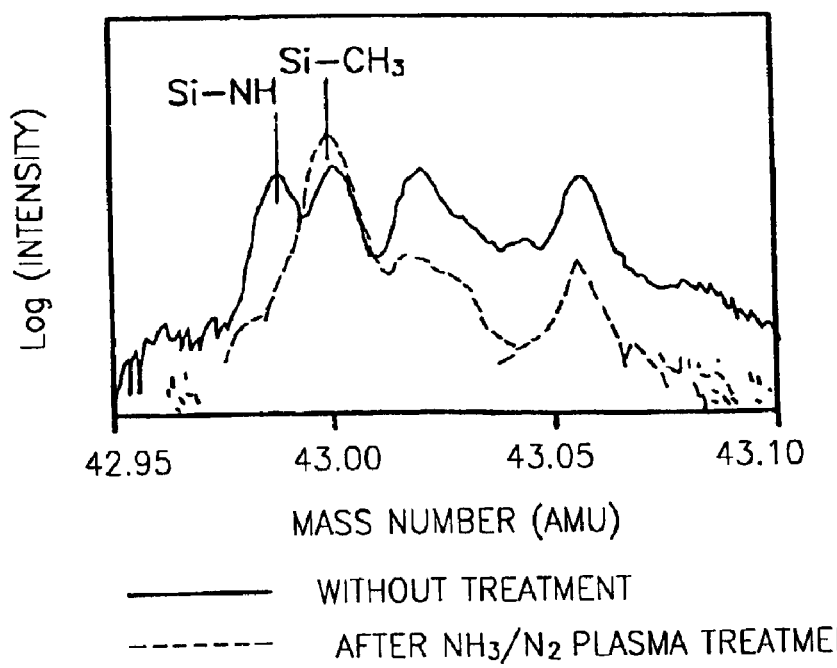
FIG. 9 is the FT-IR spectrums showing the change of a peak after the MSQ layer is treated with $NH_3/N_2$ plasma.

FIG. 9 shows the FT-IR spectrums, which show that the peak intensity of the Si—$CH_3$ bond is reduced and the peak of the Si—NH bond is formed after the MSQ layer is treated with $NH_3/N_2$ plasma.

Table 3 shows the results of analyzing the components of the surface of the MSQ layer by the XPS analysis after performing various treatments on the surface of the MSQ layer. Other conditions which are not provided in the Table 3 are the same as the conditions shown in the Table 2.

TABLE 3

|  | [Si] (%) | [O] (%) | [C] (%) | [N] (%) | [O]/[Si] |
|---|---|---|---|---|---|
| $O_2$ plasma treatment (7 seconds) | 30 | 66 | 4 | 0 | 2.2 |
| $N_2O$ plasma treatment (10 seconds) | 30 | 65 | 4 | 0 | 2.1 |
| $NH_3/N_2$ plasma treatment (100 seconds) | 33 | 47 | 4 | 17 | 1.4 |
| Formation of buffer layer (1000 Å of $O_3$-TEOS layer) | 31 | 66 | 3 | 0 | 2.1 |
| MSQ layer before treatment | 29 | 46 | 25 | 0 | 1.6 |

In Table 3, when the MSQ layer is treated with $NH_3/N_2$ plasma, about 17% of the nitride component is contained. This proves the self-passivation effect confirmed by the result of FIG. 8.

Also, it is noted from the results of Table 3 that the carbon component is reduced by greater than or equal to 80% at the surface of the MSQ layer and that [O]/[Si] is increased by greater than or equal to 37% when the MSQ layer is treated with plasma according to the present invention or the buffer layer is formed on the MSQ layer.

The adhesion characteristic between the MSQ layer and the PE-TEOS layer is estimated by forming the MSQ layer having a thickness of 4000 Å on the silicon substrate, performing various treatments shown in Table 4 on the surface of the MSQ layer, forming the TEOS layer by a PECVD method (hereinafter, "PE-TEOS layer) on the MSQ layer whose surface is treated as an upper dielectric layer to a thickness of 8000 Å, and investigating whether the PE-TEOS layer is lifted from the surface of the MSQ layer when the CMP process is performed on the PE-TEOS layer, with respect to the case where a metal wiring pattern is formed on the silicon substrate and the case where the metal wiring pattern is not formed on the silicon substrate, on the basis of the above experiment results.

Here, when the metal wiring pattern is formed on the silicon substrate, an aluminum wiring pattern having a thickness of 5000 Å is formed as the metal wiring pattern between the respective patterns to form a gap and the aluminum wiring pattern is capped by the PE-TEOS layer having the thickness of 500 Å.

The result is shown in Table 4. Other conditions which are not provided in the Table 4 are the same as the conditions shown in the Table 2.

TABLE 4

| Surface treatment method | | Case where metal wiring pattern is not formed | Case where metal wiring pattern is formed |
|---|---|---|---|
| Plasma treatment | O₂ plasma treatment (80 seconds) | ◯ | ◯ |
| | N₂O plasma treatment (100 seconds) | ◯ | ◯ |
| | NH₃/N₂ plasma treatment (10 seconds) | ◯ | ◯ |
| Formation of buffer layer | O₃-TEOS layer (1000 Å) | ◯ | ◯ |

In Table 4, "◯" means that the PE-TEOS layer is not lifted from the MSQ layer. When the above various treatments are performed on the surface of the MSQ layer, the upper dielectric layer is not lifted from the MSQ layer in the CMP step.

A method of forming a multi-layered dielectric layer, which can be realized according to preferred embodiments of the present invention will be described in detail based on the above results.

In the present invention, two representative embodiments are provided. In a first embodiment, in order to improve the adhesion characteristic between a first insulating layer including the Si—CH₃ bond and an upper dielectric layer deposited thereon, the first insulating layer is treated with plasma so that the carbon component is removed from the surface of the first insulating layer and an adhesion surface removed of the Si—CH₃ bond is formed. In a second embodiment, an adhesion surface which provides excellent adhesion power between the first insulating layer and the upper dielectric layer is formed on the first insulating layer by forming an additional buffer layer on the first insulating layer in order to improve the adhesion characteristic between the first insulating layer including the Si—CH₃ bond and the upper dielectric layer deposited thereon.

The term "interlayer dielectric film" used throughout this specification means insulating layers formed on a conductive pattern such as a gate electrode formed directly on the semiconductor substrate. Also, the term "intermetal dielectric film" means insulating layers formed on a conductive line formed on a metal line, which is formed on the surface of the semiconductor substrate, but not directly on the semiconductor substrate. It is apparent to anyone skilled in the art that what can be applied to the multi-layered dielectric layer provided in the embodiments of the present invention can be applied to any dielectric layer including an interlayer dielectric film and an intermetal dielectric film. Therefore, in the following embodiments, what can be applied to an intermetal dielectric film can also be applied to an interlayer dielectric film.

FIGS. 10A through 10F are sectional views for explaining a method of forming a multi-layered dielectric layer according to the first embodiment of the present invention.

Figure 10A:
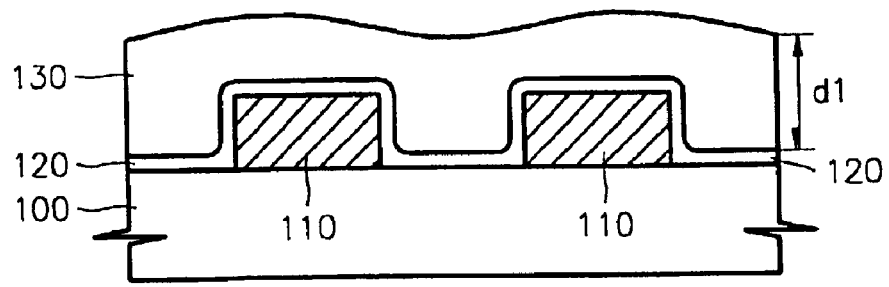
FIGS. 10A through 10F are sectional views for explaining a method for fabricating a multi-layered dielectric layer according to a first embodiment of the present invention.

Referring to FIG. 10A, first conductive patterns 110 are formed on a semiconductor substrate 100. A gap is formed between the first conductive patterns 110. The first conductive pattern 110 is a conductive layer constituted of a metal line, for example, an aluminum (Al) line formed on the semiconductor substrate 100. The first conductive pattern 110 has a thickness of about 5000 through 6000 Å.

A capping layer 120 is formed on the semiconductor substrate 100 to a thickness of about 500 Å to cover the surface of the first conductive patterns 110. The capping layer 120 can be formed of an oxide layer formed by a CVD method. The capping layer 120 is a protective layer for preventing the first conductive patterns 110 from being damaged by materials such as a carbon component generated during a successive process. The capping layer 120 can be omitted.

A first insulating layer 130 is formed on the capping layer 120 to a sufficient thickness to completely fill the gap between the first conductive patterns 110 and to cover the upper portions of the first conductive patterns 110 by a thickness of about 1000 through 2000 Å. At this time, the total thickness d1 of the first insulating layer 130 is about 6000 through 8000 Å. The first insulating layer 130 is formed of glass or a glassy layer having the Si—CH₃ bond, preferably, a methyl silsesquioxane (MSQ) layer which is a kind of a spin-on-glass (SOG) layer having a low dielectric constant and an excellent gap filling characteristic. Also, the first insulating layer 130 can be formed of a silicon oxycarbide (SiOC) layer.

The first insulating layer 130 is formed of a material including the Si—CH₃ bond. The Si—CH₃ bond is exposed on the surface of the first insulating layer 130. Therefore, adhesion between the first insulating layer 130 and an insulating layer deposited on the first insulating layer 130 can deteriorate due to a steric hindrance caused by the CH₃ group exposed on the surface of the first insulating layer 130.

Figure 10B:
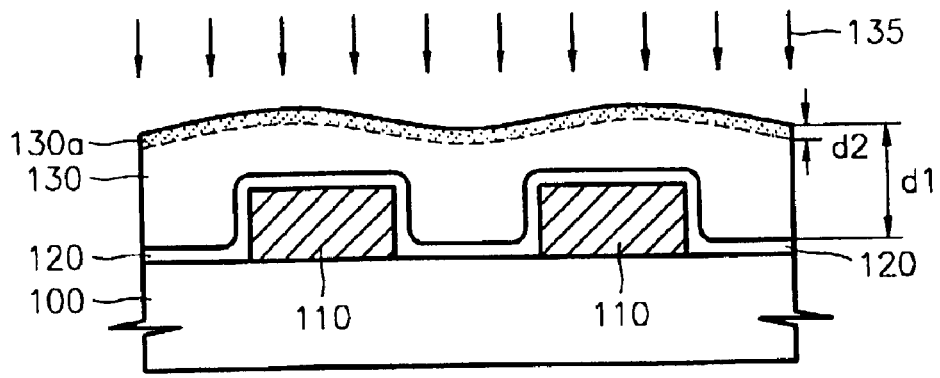

FIG. 10B is a view for describing treatment steps for improving the adhesion characteristic of the first insulating layer 130. Referring to FIG. 10B, an adhesion surface 130a removed of the Si—CH₃ bond is formed on the surface of the first insulating layer 130 by removing the carbon component from the surface of the first insulating layer 130 by treating the first insulating layer 130 with plasma 135. The adhesion surface 130a is formed as a part of the first insulating layer 130 in the first insulating layer 130 by changing the surface component of the first insulating layer 130 to a predetermined depth d2 ranging from the surface of the first insulating layer 130 to the total thickness d1 of the first insulating layer 130.

O₂ plasma, N₂O plasma, or NH₃/N₂ plasma treatment can be performed as a plasma 135 treatment method for forming the adhesion surface 130a. The conditions shown in the Table 2 can be applied as preferred process conditions in performing the respective plasma treatment methods.

As a result, the carbon component is nearly entirely removed from the adhesion surface 130a. Therefore, there is no steric hindrance between the adhesion surface 130a and the insulating layer deposited on the adhesion surface 130a.

Figure 10C:
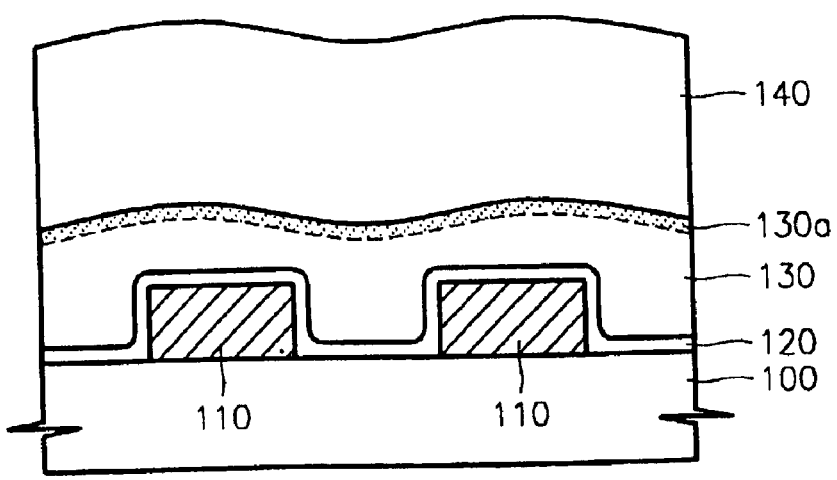

Referring to FIG. 10C, a second insulating layer 140 is formed on the adhesion layer 130a to a thickness of about 1600 Å. The second insulating layer 140 can be formed of any layer suitable for the interlayer dielectric film, for example, a PE-TEOS layer, an O₃-TEOS layer, an oxide layer formed by a low pressure CVD (LPCVD) method using SiH₄ as a source (hereinafter, "SiH₄-oxide layer"), a high density plasma (HDP) oxide layer, a hydrogen silsesquioxane (HSQ) layer, a silicon carbide (SiC) layer, a silicon nitride layer, or a silicon oxynitride layer.

As a result, a dipole—dipole interaction occurs between polar bonds which exist on the adhesion layer 130a and polar bonds of the second insulating layer 140.

For example, when the first insulating layer 130 is treated with plasma 135, namely, NH₃/N₂ plasma and the second insulating layer 140 is formed of the PE-TEOS layer, polar Si—N and N—H bonds which exist on the adhesion surface 130a strongly interact with a polar Si—O bond which exists on the second insulating layer 140. The dipole—dipole interaction at this time is much stronger than the Van der Waals interaction between the Si—CH$_3$ bond exposed on the surface of the first insulating layer 130 before forming the adhesion layer 130a on the surface of the first insulating layer 130 and the Si—O bond of the second insulating layer 140. Therefore, the bonding strength between the adhesion surface 130a and the second insulating layer 140 becomes larger.

Figure 10D:
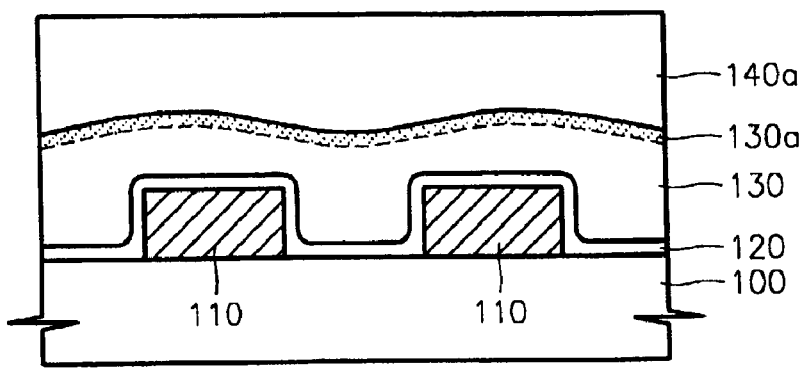

Referring to FIG. 10D, a planarized second insulating layer 140a is formed by planarizing the second insulating layer 140 by the CMP method. Although the physical force applied to the wafer is transmitted to the interface between the adhesion surface 130a and the planarized second insulating layer 140a during the CMP process, the planarized second insulating layer 140a is not lifted or taken off from the adhesion layer 130a due to the strong adhesion power caused by the dipole—dipole interaction.

Accordingly, the intermetal dielectric film, which is formed of the first insulating layer 130 including the adhesion surface 130a and the planarized second insulating layer 140a, is formed.

Figure 10E:
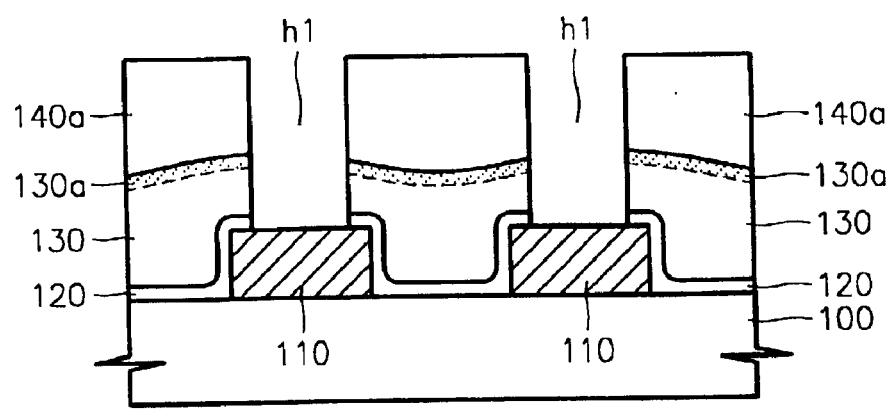

Referring to FIG. 10E, via holes h1 for exposing the upper surfaces of the first conductive patterns 110 are formed by sequentially patterning the planarized second insulating layer 140a, the first insulating layer 130 including the adhesion surface 130a, and the capping layer 120 using a photolithography process.

Since the first insulating layer 130 includes carbon, polymer induced from the carbon component included in the first insulating layer 130 (hereinafter, "carbon polymer") is piled up on the bottom of the surface to be etched during dry etching for forming the via holes h1, and prevents the first insulating layer 130 from being etched.

Accordingly, etching may be stopped at the first insulating layer 130.

In order to prevent this, O$_2$ gas or N$_2$ gas is additionally provided in order to remove the carbon polymer at the same time that an etching gas is provided during the dry etching for forming the via holes h1. Here, when the O$_2$ gas is additionally supplied with the etching gas, oxygen radicals reduce the quantity of the carbon polymer. When N$_2$ gas is additionally supplied with the etching gas, NO generated due to the reaction of N with oxygen atoms, which is an etching by-product, reduces the quantity of carbon polymer.

As a result, it is possible to prevent the etching from being stopped at the first insulating layer 130 during the etching process for forming the via holes h1, and to form desired via holes h1.

Figure 10F:
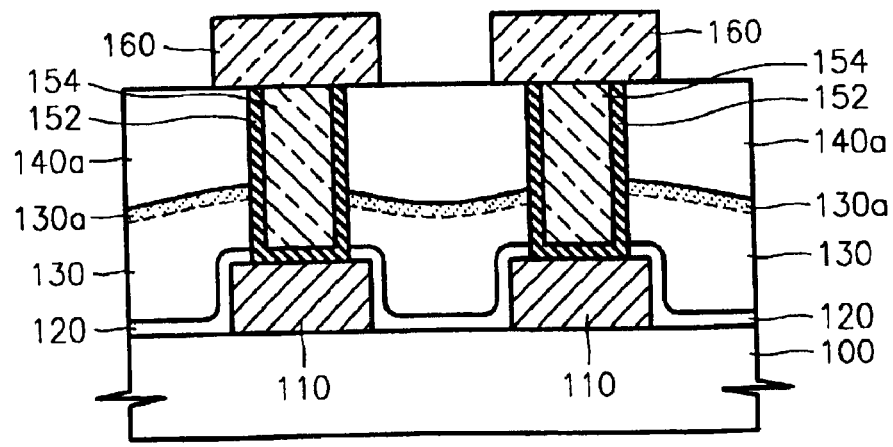

Referring to FIG. 10F, via contacts 154 are formed in the via holes h1 by forming barrier layers 152 formed of, for example, Ti/TiN on the entire surface of the resultant structure in which the via holes h1 are formed, depositing a metal such as W on the resultant structure so that the via holes h1 can be filled, and polishing the metal layer and the barrier layers 152 by the CMP process so that the upper surface of the planarized second insulating layer 140a is exposed.

The physical force can be transmitted to the interface between the adhesion surface 130a and the planarized second insulating layer 140a in the CMP step for forming the via contacts 154. However, the planarized second insulating layer 140a is not lifted or taken off from the adhesion surface 130a due to the strong adhesion power caused by the dipole—dipole interaction between the adhesion layer 130a and the planarized second insulating layer 140a.

Second conductive patterns 160 electrically connected to the first conductive patterns 110, are formed through the via contacts 154. The second conductive patterns 160 are formed by sequentially depositing, for example, Ti having a thickness of 150 Å, Al having a thickness of 5700 Å, Ti having a thickness of 150 Å, and TiN having a thickness of 400 Å, and patterning them.

The second conductive patterns 160 can be formed by a dual damascene method instead of the above method. In this case, the CMP process is performed in order to form the second conductive patterns 160. In this case, the physical force caused by the CMP process can be also transmitted to the interface between the adhesion surface 130a and the planarized second insulating layer 140a. However, the planarized second insulating layer 140a is not lifted or taken off from the adhesion surface 130a due to the strong adhesion power caused by the dipole—dipole interaction between the adhesion surface 130a and the planarized second insulating layer 140a.

In the present embodiment, since a layer having a low dielectric constant such as the first insulating layer 130 is used in order to form the intermetal dielectric film, it is possible to reduce RC delays between the first conductive patterns 110 and the second conductive patterns 160 or between the respective first conductive patterns 110.

FIGS. 11A through 11F are sectional views for describing a method for forming a multi-layered insulating layer according to a second embodiment of the present invention.

Figure 11A:
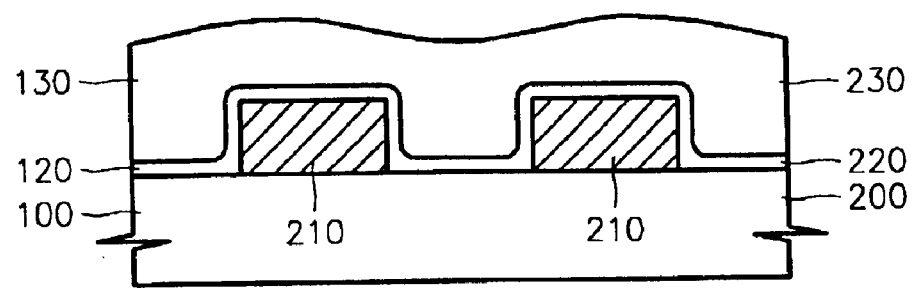
FIGS. 11A through 11F are sectional views for explaining a method for fabricating a multi-layered dielectric layer according to a second embodiment of the present invention.

Referring to FIG. 11A, first conductive patterns 210 and a capping layer 220 covering the surface of the first conductive patterns 210 are formed on a semiconductor substrate 200 and a first insulating layer 230 is formed on the capping layer 220, by the same method described with reference to FIG. 10A. The first insulating layer 230 is formed of glass or a glassy layer having the Si—CH$_3$ bond, for example, the MSQ layer or the SiOC layer.

Figure 11B:
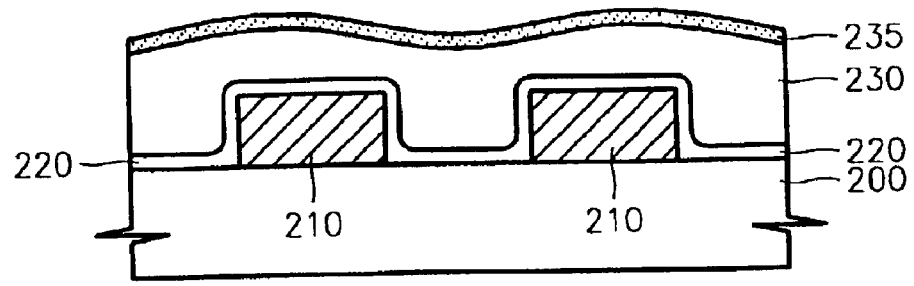

Referring to FIG. 11B, a buffer layer 235 is formed on the first insulating layer 230 to a thickness of 50 through 1000 Å. The buffer layer 235 is formed in order to improve the adhesion characteristic of the first insulating layer 230. The buffer layer 235 is preferably as thin as possible since the first insulating layer 230, which is an under layer, can be transformed when the buffer layer 235 is too thick. Preferably, the buffer layer 235 has a thickness of 50 through 1000 Å.

The buffer layer 235 is preferably formed of the USG layer, more preferably, the O$_3$-TEOS layer.

The carbon component is nearly entirely removed from the surface of the first insulating layer 230, thus removing the Si—CH$_3$ bond by forming the buffer layer 235 on the first insulating layer 230. Accordingly, the dipole—dipole interaction occurs between the first insulating layer 230 and the buffer layer 235. Therefore, the buffer layer 235 strongly adheres to the first insulating layer 230.

Figure 11C:
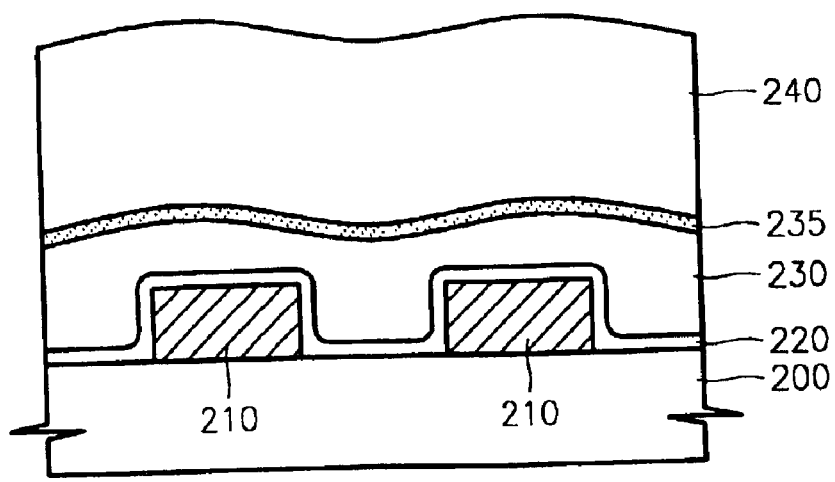

Referring to FIG. 11C, a second insulating layer 240 is formed on the buffer layer 235 by the method described with reference to FIG. 10C. Since the buffer layer 235 does not include the Si—CH$_3$ bond which can cause the steric hindrance, the second insulating layer 240 is formed on the buffer layer 235 with excellent bonding power.

Figure 11D:
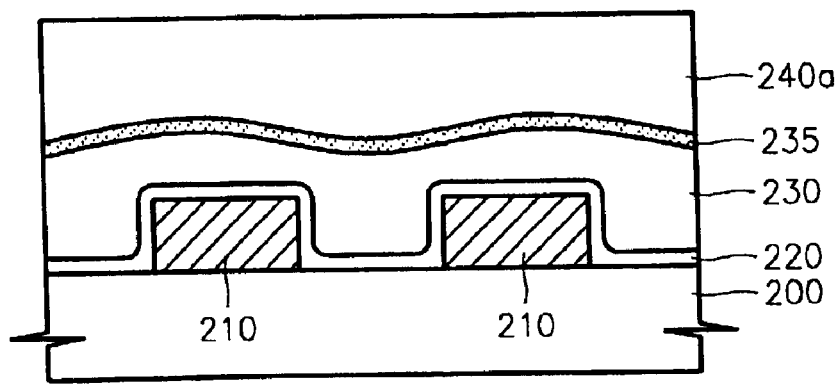

Referring to FIG. 11D, a planarized second insulating layer 240a is formed by planarizing the second insulating layer 240 by the CMP method. Although the physical force applied to the wafer during the CMP process is transmitted to the interface between the first insulating layer 230 and the buffer layer 235, or the interface between the buffer layer 235 and the planarized second insulating layer 240a, since the first insulating layer 230 and the buffer layer 235, and the buffer layer 235 and the planarized second insulating layer 240a, are combined with each other by a strong interaction, an upper layer is not lifted or taken off from either of the interfaces.

Accordingly, the intermetal dielectric film formed of the first insulating layer 230, the buffer layer 235, and the planarized second insulating layer 240a is formed.

Figure 11E:
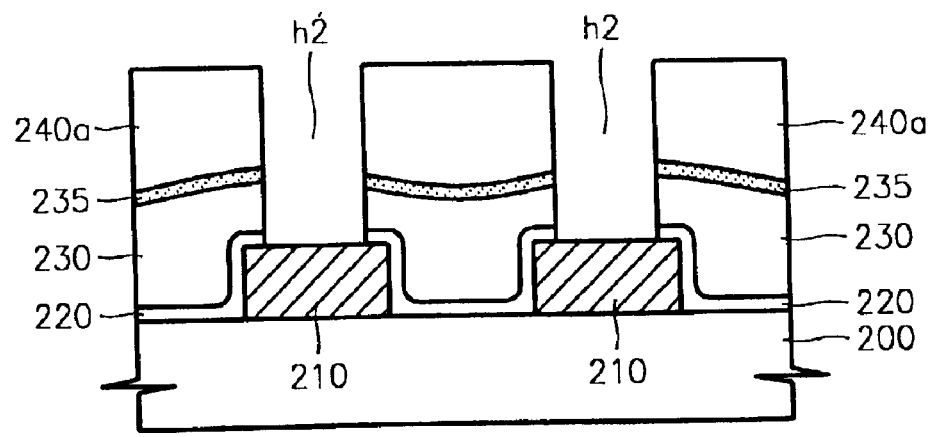

Referring to FIG. 11E, via holes h2 which expose the upper surfaces of the first conductive patterns 210 are formed by sequentially patterning the planarized second insulating layer 240a, the buffer layer 235, the first insulating layer 230, and the capping layer 220, using a photolithography process.

As described with reference to FIG. 10E, $O_2$ gas or $N_2$ gas is additionally supplied with the etching gas during the dry etching for forming the via holes h2. As a result, it is possible to prevent the etching from being stopped at the first insulating layer 230 by the carbon polymer that is created and to form desired via holes h2.

Figure 11F:
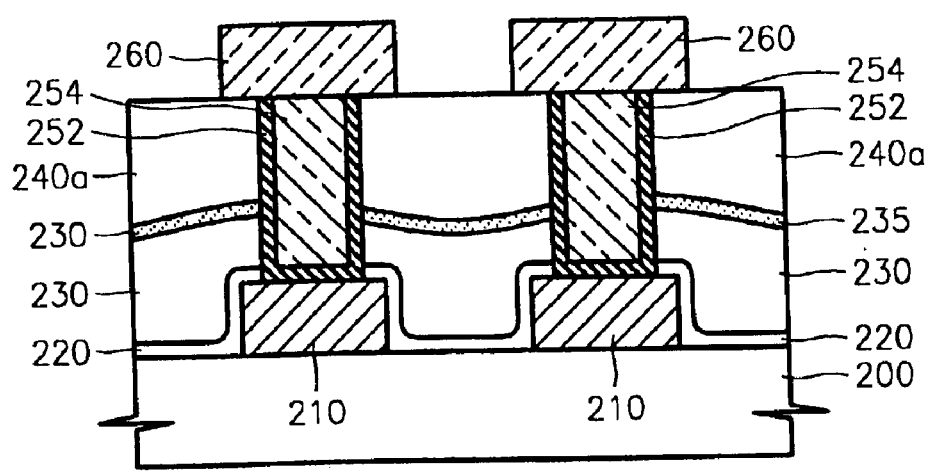

Referring to FIG. 11F, barrier layers 252 and via contacts 254 are formed in the via holes h2 by the method described with reference to FIG. 10F. In the present embodiment, physical force can be transmitted to the interface between the first insulating layer 230 and the buffer layer 235, and the interface between the buffer layer 235 and the planarized second insulating layer 240a in the CMP step for forming the via contacts 254. However, since the first insulating layer 230 and the buffer layer 235, and the buffer layer 235 and the planarized second insulating layer 240a are combined with each other by a strong interaction, an upper layer is not lifted or taken off from each interface.

Second conductive patterns 260 electrically connected to the first conductive patterns 210 are formed on the via contacts 254.

When a dual damascene process is used in order to form the second conductive patterns 260, the physical force can be transmitted to the interface between the first insulating layer 230 and the buffer layer 235, and the interface between the buffer layer 235 and the planarized second insulating layer 240a during the CMP process performed during the damascene process. However, since the first insulating layer 230 and the buffer layer 235, and the buffer layer 235 and the planarized second insulating layer 240a are combined with each other by a strong interaction, an upper layer is not lifted or taken off from either of the interfaces.

Also, since a layer having a low dielectric constant such as the first insulating layer 230 is used in forming the intermetal dielectric film, it is possible to reduce RC delays between the first conductive pattern 210 and the second conductive pattern 260 and between each of the first conductive patterns 210.

In the above embodiments, the method according to the present invention is applied to the formation of the intermetal dielectric film. However, the present invention is not restricted to the above and can be applied to the formation of an interlayer dielectric film for covering a conductive layer formed directly on the semiconductor substrate.

As mentioned above, according to the present invention, it is possible to reduce RC delays which can be generated in the metal wiring system, since a material having a low dielectric constant such as MSQ is used in order to form the multi-layered dielectric layer such as the intermetal dielectric film.

Also, in the present invention, when the layer having the low dielectric constant including the Si—$CH_3$ bond is used for forming the intermetal dielectric film, the surface of the layer having the low dielectric constant is treated with plasma or a buffer layer is formed on the surface of the layer having the low dielectric constant. As a result, the carbon component is removed from the surface of the low dielectric constant, thus removing the Si—$CH_3$ bond which can cause the steric hindrance at the interface between the layer having the low dielectric constant and an upper insulating layer. Therefore, adhesion between the layer having the low dielectric constant and the upper insulating layer is remarkably improved in forming the multi-layered dielectric layer such as the intermetal dielectric film adopting the layer having the low dielectric constant. As a result, although physical force is applied in successive processing, it is possible to prevent a peeling off phenomenon where the upper insulating layer is lifted or taken off from the interfaces between the respective insulating layers which constitute the multi-layered dielectric layer. Accordingly, it is possible to manufacture a reliable semiconductor device.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method of forming a multi-layered dielectric layer, comprising:

forming a first insulating layer including Si—CH3 bonds on conductive patterns of a semiconductor substrate;

forming a buffer layer on the first insulating layer so that a dipole—dipole interaction occurs between the first insulating layer and the buffer layer, the buffer layer does not have Si—$CH_3$ bonds therein; and forming a second insulating layer on the buffer layer.

2. The method of claim 1, wherein the first insulating layer is a methyl silsesquioxane (MSQ).

3. The method of claim 1, wherein the first insulating layer is silicon oxycarbide (SiOC).

4. The method of claim 1, wherein the buffer layer is undoped silicate glass (USG).

5. The method of claim 1, wherein the buffer layer has a thickness within a range of 50 Å to 1000 Å.

6. The method of claim 1, wherein the second insulating layer is selected from a group consisting of a PE-TEOS layer, an $O_3$-TEOS layer, a $SiH_4$-oxide layer, a high density plasma (HDP) oxide layer, a hydrogen silsesquioxane (HSQ) layer, a silicon carbide (SiC) layer, a silicon nitride layer, and a silicon oxynitride layer.

7. The method of claim 1, further comprising forming a capping layer that covers the conductive patterns.

8. The method of claim 7, wherein the capping layer is an oxide layer formed by a CVD method.

9. The method of claim 1, wherein the buffer layer is an $O_3$-TEOS layer.

* * * * *